US007968375B1

(12) United States Patent
Rahman et al.

(10) Patent No.: US 7,968,375 B1
(45) Date of Patent: Jun. 28, 2011

(54) METHOD AND APPARATUS FOR INTEGRATING CAPACITORS IN STACKED INTEGRATED CIRCUITS

(75) Inventors: Arifur Rahman, San Jose, CA (US); Stephen M. Trimberger, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 5 days.

(21) Appl. No.: 12/540,991

(22) Filed: Aug. 13, 2009

Related U.S. Application Data

(62) Division of application No. 11/701,807, filed on Feb. 1, 2007, now Pat. No. 7,605,458.

(51) Int. Cl.
H01L 21/00 (2006.01)
(52) U.S. Cl. .................. 438/109; 438/107; 257/686
(58) Field of Classification Search .................. 257/686; 438/107, 109
See application file for complete search history.

(56) References Cited

U.S. PATENT DOCUMENTS

| 5,825,080 | A | 10/1998 | Imaoka et al. |
| 6,524,926 | B1 | 2/2003 | Allman et al. |
| 7,068,072 | B2 | 6/2006 | New et al. |
| 7,193,239 | B2 | 3/2007 | Leedy |
| 7,355,273 | B2 | 4/2008 | Jackson et al. |
| 2005/0186705 | A1 * | 8/2005 | Jackson et al. ................ 438/106 |

FOREIGN PATENT DOCUMENTS

| WO | WO 02/17367 | A2 | 2/2002 |
| WO | WO 0217367 | A2 * | 2/2002 |

OTHER PUBLICATIONS

U.S. Appl. No. 12/503,429, filed Jul. 15, 2009, Rahman et al.
U.S. Appl. No. 11/701,807, filed Feb. 1, 2007, Rahman et al.
Baliga, John, "Through-Silicon Technology Applications Growing," *Semiconductor International*, Mar. 1, 2005, pp. 1-3, Reed Business Information, New York, New York, USA.
Bollmann, D., "Three Dimensional Metallization for Vertically Integrated Circuits," *Proc. of the 1997 European Workshop on Materials for Advanced Metallization*, Mar. 16, 1997, pp. 94-98, IEEE, Piscataway, New Jersey, USA.
Garrou, Philip, "Future ICs Go Vertical," *Semiconductor International*, Feb. 1, 2005, pp. 1-9, Reed Business Information, New York, New York, USA.
Guarini, K.W. et al., "Electrical Integrity of State-of-the-Art 0.13 μm SOI CMOS Devices and Circuits Transferred for Three-Dimensional (3D) Integrated Circuit (IC) Fabrication," *International Electron Devices Meeting Digest*, Dec. 8, 2002, pp. 943-945, IEEE, Piscataway, New Jersey, USA.
Ieong, Meikei, "Three Dimensional CMOS Devices and Integrated Circuits," *Proc. of the IEEE 2003 Custom Integrated Circuits Conference*, Sep. 21, 2003, pp. 207-213, IEEE, Piscataway, New Jersey, USA.
Kuhn, Stefan A. et al., "Interconnect Capacitances, Crosstalk, and Signal Delay in Vertically Integrated Circuits," *Proc. of the International Electron Devices Meeting*, Dec. 10, 1995, pp. 249-252, IEEE, Piscataway, New Jersey, USA.
Rahman, Arifur, "Die Stacking Technology for Terabit Chip-to-Chip Communications," *Proc. of the 2006 IEEE Custom Integrated Circuits Conference*, Sep. 10, 2006, pp. 587-590, IEEE, Piscataway, New Jersey, USA.
Ryu, Chunghyun et al., "High Frequency Electrical Model of Through Wafer Via for 3-D Stacked Chip Packaging," *Proc. of the 2006 Electronics Systemintegration Technology Conference*, Sep. 5, 2006, pp. 215-220, IEEE, Piscataway, New Jersey, USA.

* cited by examiner

*Primary Examiner* — Thanh V Pham
*Assistant Examiner* — Marvin Payen
(74) *Attorney, Agent, or Firm* — Robert M. Brush; LeRoy D. Maunu; Lois D. Cartier

(57) ABSTRACT

Method and apparatus for integrating capacitors in stacked integrated circuits are described. One aspect of the invention relates to a semiconductor assembly having a carrier substrate, a plurality of integrated circuit dice, and at least one metal-insulator-metal (MIM) capacitor. The integrated circuit dice are vertically stacked on the carrier substrate. Each MIM capacitor is disposed between a first integrated circuit die and a second integrated circuit die of the plurality of integrated circuit dice. The at least one MIM capacitor is fabricated on at least one of a face of the first integrated circuit die and a backside of the second integrated circuit die.

12 Claims, 8 Drawing Sheets

US 7,968,375 B1

METHOD AND APPARATUS FOR INTEGRATING CAPACITORS IN STACKED INTEGRATED CIRCUITS

FIELD OF THE INVENTION

One or more aspects of the present invention relate generally to semiconductor devices and, more particularly, to a method and apparatus for integrating capacitors in stacked integrated circuits.

BACKGROUND

As semiconductor technology has advanced, the amount and speed of logic available on an integrated circuit (IC) has increased more rapidly than the number and performance of input/output (I/O) connections. As a result, IC die stacking techniques have received renewed interest to address the interconnection bottleneck of high-performance systems. In stacked IC applications, two or more ICs are stacked vertically and interconnections between them are made by wire bonding at the chip peripheries or by forming high aspect ratio "through die vias" (TDVs). There are several known approaches for stacking ICs. Multiple silicon device layers can be grown epitaxially or fully processed ICs can be bonded for vertical integration.

As ICs have become more complex, employing more and more pins in a limited area, and more I/O signal pins are switching at high speed at the same time, decoupling the power supplies through efficient usage of low inductance capacitors has become increasingly essential. Such capacitors may be integrated into an IC (on-chip) or integrated within the packaging substrate of the IC or the printed circuit board (PCB) to which the IC is mounted (off-chip). The inductance of interconnects connecting the on-chip power supply grid to the off-chip decoupling capacitors is typically too high, reducing the effectiveness of the off-chip decoupling capacitors at high frequencies. Interconnect inductance is even more of a problem for stacked ICs, as the distance between the ICs and the packaging substrate or PCB increases. Thus, it is desirable to integrate decoupling capacitors within close proximity to the on-chip power supply grid.

Conventionally, on-chip capacitors are implemented using polysilicon-over-diffusion and polysilicon-over-polysilicon techniques. Both of these implementations, however, lead to a large area overhead on the layout of the IC. Other on-chip capacitors have been formed by utilizing metal-to-polysilicon or metal-to-metal capacitance. Because the separation between metal layers on the same interconnect plane or neighboring interconnect planes is typically much larger than the gate oxide thickness, the capacitance per unit area is generally smaller. While it is feasible to integrate inter-layer dielectric (ILD) with a higher dielectric constant (high-k), such an ILD leads to higher resistance-capacitance (RC) delay if a signal wire is routed on the metal layer above or below the high-k ILD layer.

Accordingly, there exists a need in the art for an improved method and apparatus for integrated capacitors in stacked ICs.

SUMMARY

One aspect of the invention relates to a semiconductor assembly having a carrier substrate, a plurality of integrated circuit dice, and at least one metal-insulator-metal (MIM) capacitor. The integrated circuit dice are vertically stacked on the carrier substrate. Each MIM capacitor is disposed between a first integrated circuit die and a second integrated circuit die of the plurality of integrated circuit dice. The at least one MIM capacitor is fabricated on at least one of a face of the first integrated circuit die and a backside of the second integrated circuit die.

Another aspect of the invention relates to a method of fabricating a semiconductor device. Integrated circuitry is formed on a face side of a first substrate. Through die vias (TDVs) are formed each extending from the face side of the first substrate towards a backside of the first substrate. Conductive interconnect is formed on the face side of the first substrate. The conductive interconnect is electrically coupled to the TDVs. The backside of the first substrate is thinned to expose the TDVs. At least one metal layer is patterned on the backside of the first substrate to form at least one plate of at least one metal-insulator-metal (MIM) capacitor each electrically coupled to at least one of the TDVs.

Another aspect of the invention relates to a method of fabricating a semiconductor device. Integrated circuitry is formed on a face side of a first substrate. Conductive interconnect is formed on the face side of the first substrate, the conductive interconnect including metal layers and vias. At least one additional metal layer and additional vias are patterned on the face side of the first substrate to form at least one plate of at least one metal-insulator-metal (MIM) capacitor electrically coupled to at least one via of the vias and the additional vias.

BRIEF DESCRIPTION OF THE DRAWINGS

The accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
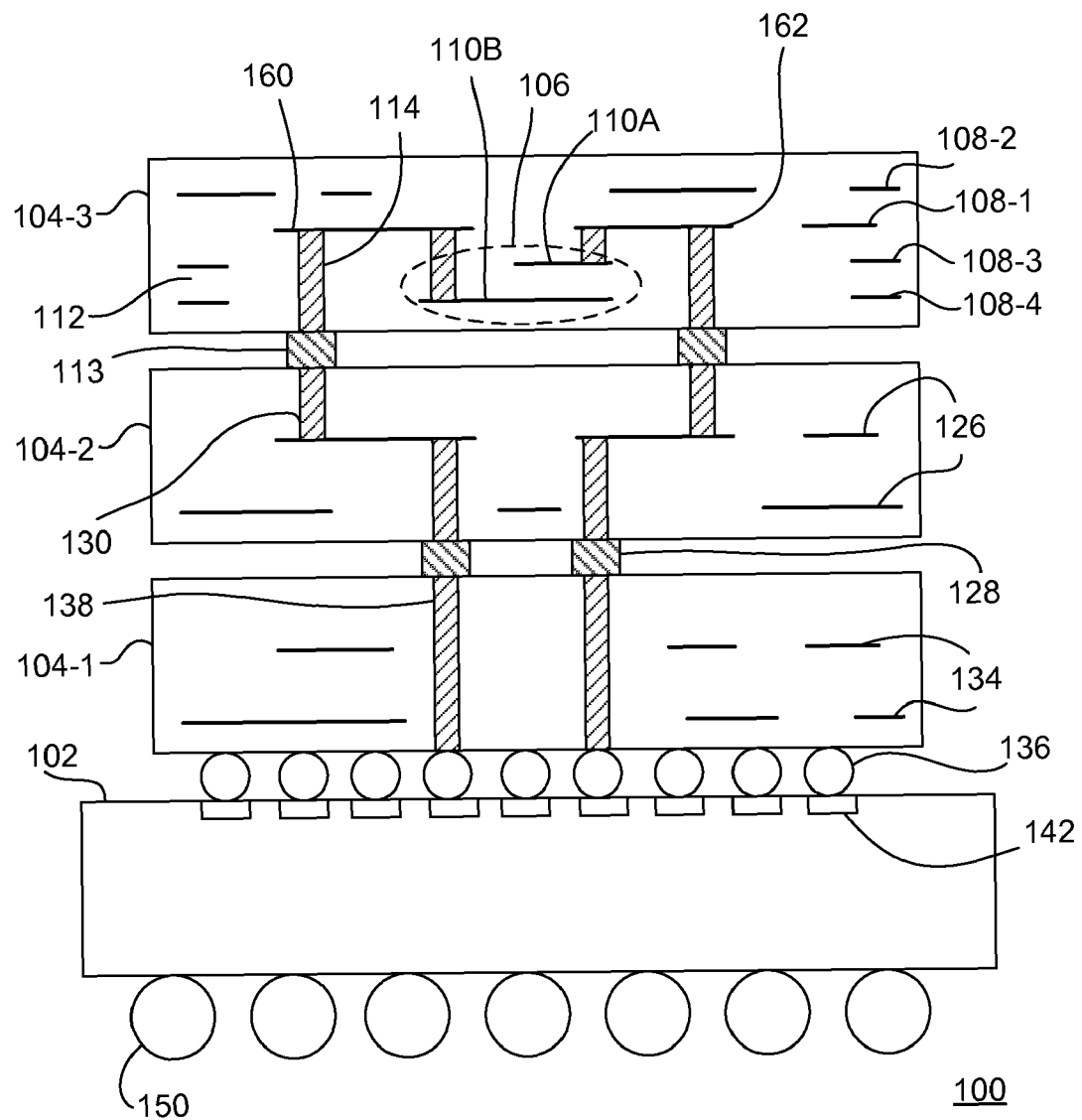
FIG. 1 is a cross-sectional view showing an exemplary embodiment of a semiconductor device in accordance with one or more aspects of the invention.

FIG. 1 is a cross-sectional view showing an exemplary embodiment of a semiconductor device 100 in accordance with one or more aspects of the invention. The semiconductor device 100 includes a carrier substrate 102 and semiconductor dice 104-1, 104-2, and 104-3 (collectively referred to as dice 104). Each die 104 includes circuitry (not shown) formed on a semiconductor substrate. The dice 104 are vertically stacked and mounted to the carrier substrate 102. In the embodiment shown, each of the dice 104 is mounted face side down in flip-chip fashion. The term "face side" denotes the side of a die that receives the bulk of semiconductor processing such that circuitry is fabricated on that face side of the die. The side of a die opposite the face side is referred to as the backside of the die. In one embodiment, an MIM capacitor 106 is formed on the face side of the die 104-3 and opposite the die 104-2 (i.e., between the die 104-3 and the die 104-2).

Each die 104 includes conductive interconnect. The conductive interconnect generally includes a plurality of metal layers patterned using known photolithography techniques, an array of contacts on the face side, and a pattern of vias. The contacts provide an external interface to the circuitry formed on the die. The vias electrically interconnect various portions of the metal layers and contacts. Suitable materials for the metal layers, vias, and contacts can include, for example, aluminum, chromium, titanium, nickel, iridium, copper, gold, tungsten, silver, platinum, palladium, tantalum, molybdenum, or alloys of such materials. The metal layers are separated from one another by layers of dielectric material, referred to as interlayer dielectric (ILD). Examples of conductive interconnect for the dice 104 are shown in FIG. 1 and described below.

In particular, the die 104-3 includes metal layers 108-1 through 108-4 and vias 114. The metal layers 108-1 and 108-2 are patterned to form conventional interconnect layers for the integrated circuitry (e.g., signal, power, and/or ground layers). For example, the metal layer 108-1 may be metal layer 1 (M1), and the metal layer 108-2 may be metal layer 2 (M2) of the die 104-3. The die 104-3 may include more than two conventional interconnect layers. For example, present state of the art technology (e.g., 65 nm processing) may provide up to 12 metal layers (M1 through M12). The metal layers 108-3 and 108-4 are patterned on the face of the die 104-3 to form the MIM capacitor 106. The die 104-3 also includes an array of lands 113 on the face-side. For example, the lands 113 may comprise micro-bumps or like type contacts. The die 104-3 is configured for flip-chip bonding with the die 104-2 by electrically and mechanically coupling the lands 113 with matching conductors on the die 104-2 (e.g., through-die vias, as discussed below).

Portions of the metal layers 108-3 and 108-4 comprise plates 110A and 110B, respectively, of the MIM capacitor 106. In the present embodiment, the MIM capacitor 106 is a parallel plate capacitor in that the plates 110A and 110B are parallel or substantially parallel to each other. A dielectric of the MIM capacitor 106 is composed of a portion of an ILD 112 between the metal layers 108-3 and 108-4. In one embodiment, the ILD 112 comprises a high-dielectric constant (high-k) dielectric material, such as tantalum pentoxide or the like. The ILD between other metal layers may comprise a conventional dielectric material, such as silicon dioxide, phospho-Silicate Glass (PSG), Boron-Doped PSG (BPSG), tetraethyl-ortho-silicate (TEOS), and the like. That is, the dielectric constant of the ILD 112 may be higher than the dielectric constant of the material between the other metal layers. In this manner, the MIM capacitor 106 may exhibit higher capacitance.

The plate 110A is electrically coupled to a portion 162 of the conductive layer 108-1 through a via, which in turn is electrically coupled to one of the lands 113 through a via. The plate 110B is electrically coupled to a portion 160 of the conductive layer 108-1 through a via, which in turn is electrically coupled to one of the lands 113 through a via. In this manner, the plates 110A and 110B of the MIM capacitor 106 are electrically accessible via the lands 113.

The die 104-2 includes metal layers 126, vias 130, an array of lands 128 (e.g., micro-bumps) on the face side. Each of the vias 130 extends from the backside of the die 104-2 to one of the metal layers 126 within the die 104-2. The vias 130 are referred to as through-die vias (TDVs). At the backside of the die 104-2, the TDVs 130 are mechanically and electrically connected to respective ones of the lands 113 on the face side of the die 104-3. Within the die 104-2, the TDVs 130 are electrically connected to respective portions of the metal layers 126. The die 104-2 is configured for flip-chip bonding with the die 104-1 by electrically and mechanically coupling the lands 128 with matching conductors on the die 104-1 (e.g., TDVs).

The die 104-1 includes metal layers 134, vias 138, and an array of bump contacts 136 on the face side. The vias 138 are TDVs. At the backside of the die 104-1, the TDVs 138 are electrically connected to respective ones of the lands 128 on the face side of the die 104-2. At the face side of the die 104-1, the TDVs 138 are electrically connected to respective ones of the bump contacts 136. The die 104-1 is configured for flip-chip bonding with the carrier substrate 102 by electrically and mechanically coupling the bump contacts 136 with matching conductors on the carrier substrate (e.g., conductive lands).

The carrier substrate 102 includes conductive interconnect, similar to that of the die 104. Notably, at the top surface of the carrier substrate 102, a conductive layer is patterned to form lands 142. The substrate 102 may also include various metal layers and vias, similar to the die 104 (not shown). The die 104-1 is mounted face down on the top surface of the carrier substrate 102 in a flip-chip manner. The bump contacts 136 are registered with matching ones of the lands 142 and then reflowed to form solder joints. The solder joints provide an electrical and mechanical connection between the die 104-1 and the carrier substrate 102. This technique for mounting the die 104-1 on the carrier substrate 102 is known as controlled collapse chip connect (C4). The carrier substrate 102 includes an array of solder balls 150 on the bottom surface thereof. The solder balls 150 may be registered with matching conductors on a circuit board, for example, and then reflowed to electrically connect the semiconductor device 100 to the circuit board.

The MIM capacitor 106 may be used to perform various functions. For example, the MIM capacitor 106 may be used to bypass noise in a power distribution network for the device 100 (e.g., a decoupling capacitor). Alternatively, the MIM capacitor 106 may be used as a compensation capacitor in a feedback circuit, to implement analog functions for switched capacitor applications, as well as any other type of capacitor application known in the art.

In one embodiment, the MIM capacitor 106 is coupled across power and ground in a power distribution network of the semiconductor device 100 in order to function as a decoupling capacitor. The portion 160 of the conductive layer 108-1 may provide ground, and the portion 162 of the conductive layer 108-1 may provide power. The portions 160 and 162 receive ground and power through connections to their respective ones of the lands 113, the die 104-2, the die 104-1, and the carrier substrate 102. In this manner, a decoupling capacitor may be fabricated closer to the power grid of the die 104-3 than would be possible with capacitors included on the carrier substrate 102 or on a circuit board, which provides for less parasitic inductance. For example, the MIM capacitor 106 may be configured to exhibit capacitance in the range of 10 nF to 100 nF, with a parasitic inductance of less than 100 pH.

Although three die 104 are shown by example, it is to be understood that the semiconductor device 100 may generally include a plurality of die (e.g., two, three, four, or more than four dice). Although a single MIM capacitor is shown between the top two die, those skilled in the art will appreciate that one or more MIM capacitors may be formed as described above between any two die in the semiconductor device. MIM capacitors between adjacent dice can be formed in the manner shown, for example, in FIG. 1. MIM capacitors between non-adjacent dice can be implemented using TDVs that extend through the one or more intervening dice. For purposes of clarity, only portions of the conductive interconnect in each of the die 104 are shown as related to the MIM capacitor 106. Those skilled in the art will appreciate that the die 104-1 through 104-3 may have more elaborate interconnect structures (e.g., more metal layers, more vias, etc.).

Figure 2:
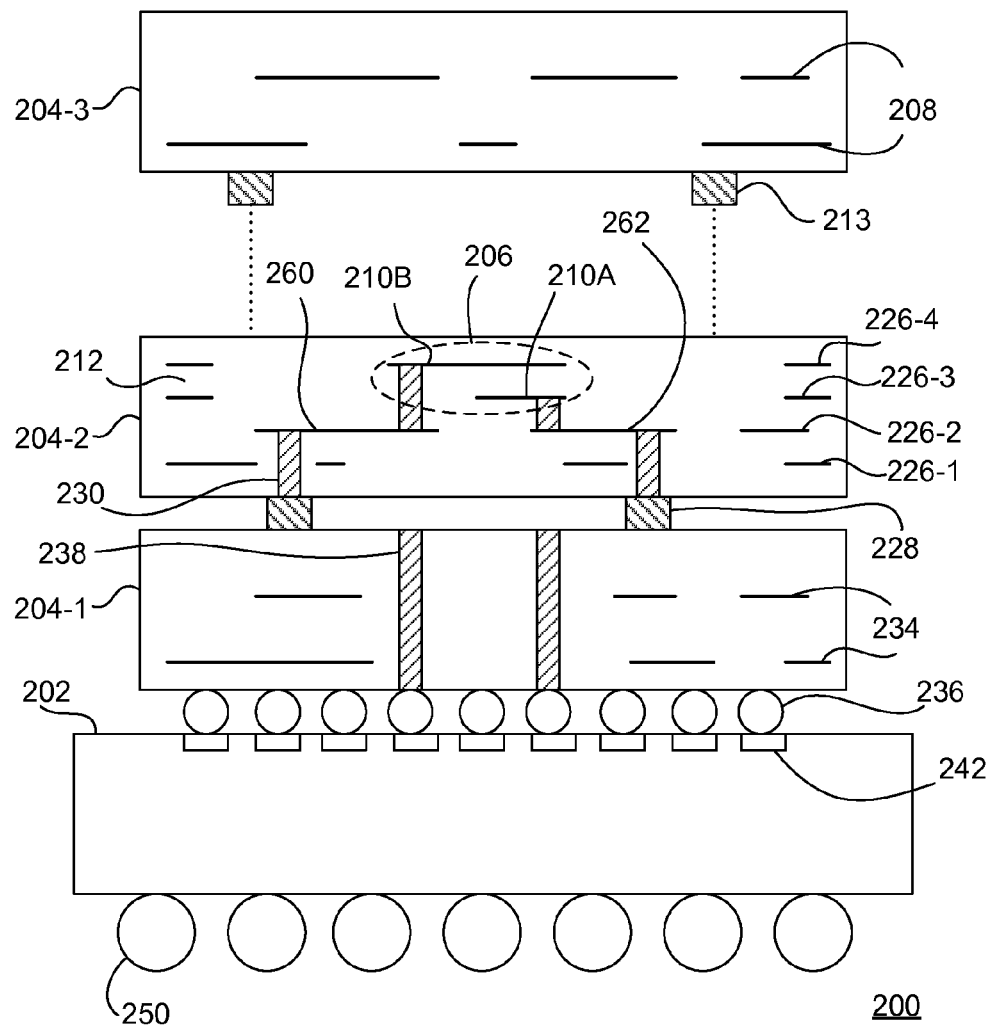
FIG. 2 is a cross-sectional view showing another exemplary embodiment of a semiconductor device in accordance with one or more aspects of the invention.

FIG. 2 is a cross-sectional view showing another exemplary embodiment of a semiconductor device 200 in accordance with one or more aspects of the invention. The semiconductor device 200 is similar to the semiconductor device 100, but in the present embodiment, an MIM capacitor is formed on the backside of a die. The semiconductor device includes a carrier substrate 202 and semiconductor die 204-1 through 204-3 (collectively referred to as die 204). The die 204 are vertically stacked and mounted to the carrier substrate 202. In the embodiment shown, each of the die 204 is mounted face side down in flip-chip fashion. An MIM capacitor 206 is formed on the backside of the die 204-2 opposite the face side of the die 204-3. The MIM capacitor 206 may be used to perform the various functions described above (e.g., decoupling capacitor). For clarity, the die 204-3 is shown separated from the device 200.

Each die 204 includes conductive interconnect similar to the die 104 of FIG. 1. In particular, the die 204-3 includes metal layers 208 and an array of lands 213 formed on the face side. For simplicity, vias are not shown in the die 204-3. The die 204-2 includes metal layers 226-1 through 226-4 and vias 230. The metal layers 226-1 and 226-2 are patterned to form conventional interconnect layers for the integrated circuitry (e.g., signal, power, and/or ground layers). The metal layers 226-3 and 226-4 are patterned on the backside of the die 204-2 to form the MIM capacitor 206. The die 204-2 also includes an array of lands 228 on the face-side. For example, the lands 228 may comprise micro-bumps or like type contacts. The die 204-2 is configured for flip-chip bonding with the die 204-1 by electrically and mechanically coupling the lands 228 with matching conductors on the die 204-1 (e.g., through-die vias).

Portions of the metal layers 226-3 and 226-4 comprise plates 210A and 210B, respectively, of the MIM capacitor 206. In the present embodiment, the MIM capacitor 206 is a parallel plate capacitor in that the plates 210A and 210B are parallel or substantially parallel to each other. A dielectric of the MIM capacitor 206 is composed of a portion of an ILD 212 between the metal layers 226-3 and 226-4. In one embodiment, the ILD 112 comprises a high-k dielectric material. The ILD between other metal layers may comprise a conventional dielectric material.

The plate 210A is electrically coupled to a portion 262 of the conductive layer 226-2 through a via, which in turn is electrically coupled to one of the lands 228 through a via. The plate 210B is electrically coupled to a portion 260 of the conductive layer 226-1 through a via, which in turn is electrically coupled to one of the lands 228 through a via. In this manner, the plates 210A and 210B of the MIM capacitor 106 are electrically accessible via the lands 228.

The die 204-1 includes metal layers 234, vias 238, and an array of bump contacts 236 on the face side. The vias 238 are TDVs. At the backside of the die 204-1, the TDVs 238 are electrically connected to respective ones of the lands 228 on the face side of the die 204-2. At the face side of the die 204-1, the TDVs 238 are electrically connected to respective ones of the bump contacts 236. The die 204-1 is configured for flip-chip bonding with the carrier substrate 202 by electrically and mechanically coupling the bump contacts 236 with matching conductors on the carrier substrate (e.g., conductive lands).

The carrier substrate 202 includes conductive interconnect, similar to that of the die 204. Notably, at the top surface of the carrier substrate 202, a conductive layer is patterned to form lands 242. The substrate 202 may also include various metal layers and vias, similar to the die 204 (not shown). The die 204-1 is mounted face down on the top surface of the carrier substrate 202 in a flip-chip manner. The carrier substrate 202 includes an array of solder balls 250 on the bottom surface thereof. The solder balls 250 may be registered with matching conductors on a circuit board, for example, and then reflowed to electrically connect the semiconductor device 200 to the circuit board.

Although three die 204 are shown by example, it is to be understood that the semiconductor device 200 may generally include a plurality of die (e.g., two, three, four, or more than four dice). Although a single MIM capacitor is shown between the top two die, those skilled in the art will appreciate that one or more MIM capacitors may be formed as described above between any two die in the semiconductor device. MIM capacitors between adjacent dice can be formed in the manner shown, for example, in FIG. 2. MIM capacitors between non-adjacent dice can be implemented using TDVs that extend through the one or more intervening dice. For purposes of clarity, only portions of the conductive interconnect in each of the die 204 are shown as related to the MIM capacitor 206. Those skilled in the art will appreciate that the die 204-1 through 204-3 may have more elaborate interconnect structures (e.g., more metal layers, more vias, etc.).

In one embodiment, the MIM capacitor 206 is coupled across power and ground in a power distribution network of the semiconductor device 200 in order to function as a decoupling capacitor. The portion 260 of the conductive layer 226-2 may provide ground, and the portion 262 of the conductive layer 226-2 may provide power. The portions 260 and 262 receive ground and power through connections to their respective ones of the lands 228, the die 204-1, and the carrier substrate 202. In this manner, a decoupling capacitor may be fabricated closer to the power grid of the die 204-2 than would be possible with capacitors included on the carrier substrate 102 or on a circuit board, which provides for less parasitic inductance. For example, the MIM capacitor 206 may be configured to exhibit capacitance in the range of 10 nF to 100 nF, with a parasitic inductance of less than 100 pH.

Figure 3:
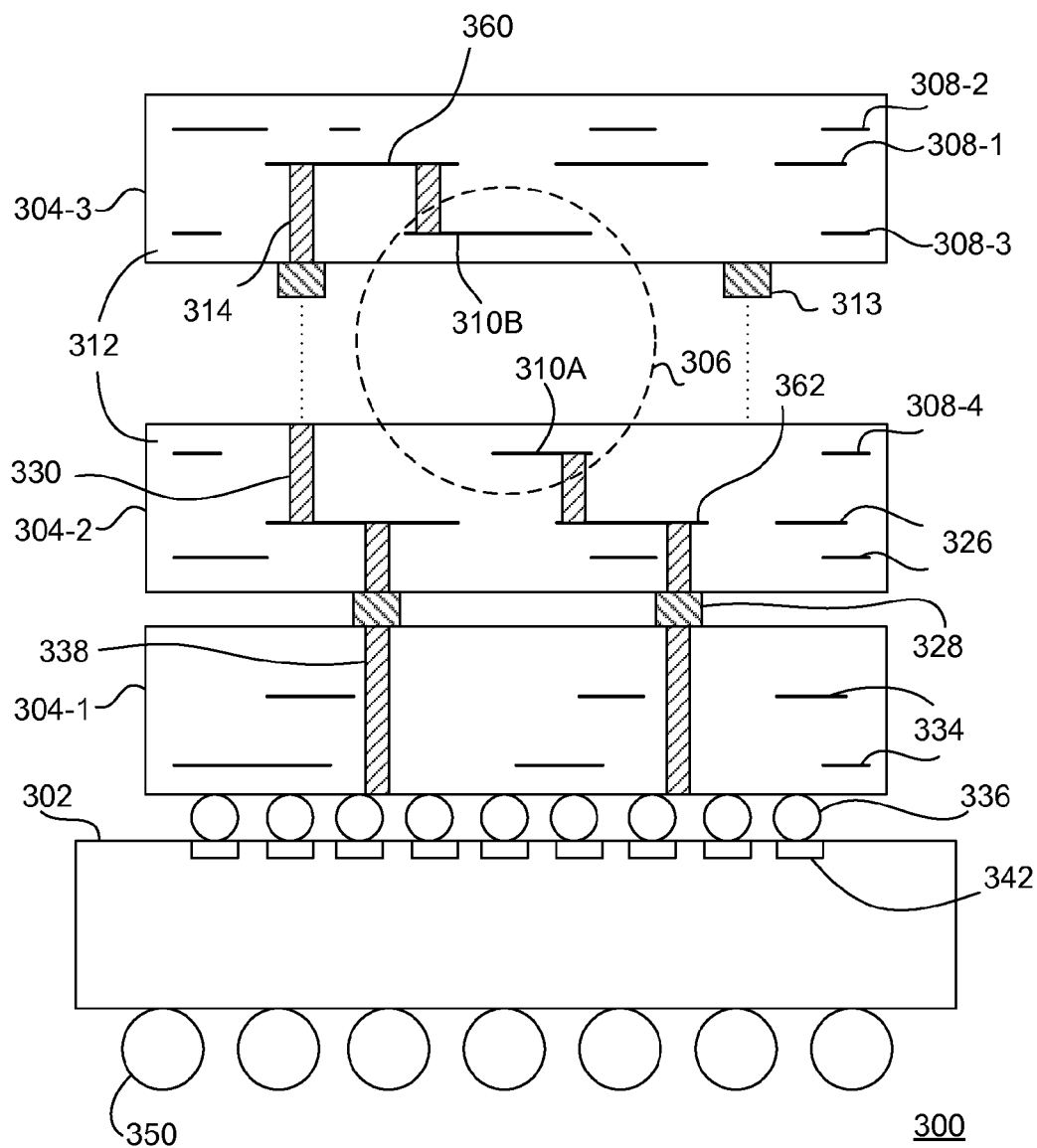
FIG. 3 is a cross-sectional view showing yet another exemplary embodiment of a semiconductor device in accordance with one or more aspects of the invention.

FIG. 3 is a cross-sectional view showing yet another exemplary embodiment of a semiconductor device 300 in accordance with one or more aspects of the invention. The semiconductor device 300 is similar to the semiconductor devices 100 and 200, but in the present embodiment, a one plate of an MIM capacitor is formed on the backside of a die, and another plate is formed on the face side of another die. The semiconductor device includes a carrier substrate 302 and semiconductor die 304-1 through 304-3 (collectively referred to as die 304). The die 304 are vertically stacked and mounted to the carrier substrate 302. In the embodiment shown, each of the die 304 is mounted face side down in flip-chip fashion. An MIM capacitor 306 is formed between the backside of the die 304-2 and the face side of the die 304-3. The MIM capacitor 306 may be used to perform the various functions described above (e.g., decoupling capacitor).

Each die 304 includes conductive interconnect similar to the die 104 of FIG. 1 and the die 204 of FIG. 2. In particular, the die 304-3 includes metal layers 308-1 through 308-3 and vias 314. The metal layers 308-1 and 308-2 are patterned to form conventional interconnect layers for the integrated circuitry (e.g., signal, power, and/or ground layers). The metal layer 308-3 is patterned on the face of the die 304-3 to form a portion of the MIM capacitor 306. The die 304-3 also includes an array of lands 313 on the face-side. For example, the lands 313 may comprise micro-bumps or like type contacts. The die 304-3 is configured for flip-chip bonding with the die 304-2 by electrically and mechanically coupling the lands 313 with matching conductors on the die 304-2 (e.g., through-die vias, as discussed below).

The die 304-2 includes metal layers 326 (e.g., two are shown) and vias 330. The metal layers 326 are patterned to form conventional interconnect layers for the integrated circuitry (e.g., signal, power, and/or ground layers). The metal layer 308-4 is patterned on the backside of the die 304-2 to form a portion of the MIM capacitor 306. The die 304-2 also includes an array of lands 328 on the face-side. For example, the lands 328 may comprise micro-bumps or like type contacts. The die 304-2 is configured for flip-chip bonding with the die 304-1 by electrically and mechanically coupling the lands 328 with matching conductors on the die 304-1 (e.g., through-die vias).

A portion of the metal layer 308-3 comprises a plate 310B of the MIM capacitor 306. A portion of the metal layer 308-4 comprises a plate 310A of the MIM capacitor 306. In the present embodiment, the MIM capacitor 306 is a parallel plate capacitor in that the plates 310A and 310B are parallel or substantially parallel to each other. The plate 310B is electrically coupled to a portion 360 of the conductive layer 308-1 through a via, which in turn is electrically coupled to one of the lands 313 through a via. The plate 310A is electrically coupled to a portion 362 of the conductive layer 326 through a via, which in turn is electrically coupled to one of the lands 328 through a via. A dielectric of the MIM capacitor 306 is composed of a portion of an ILD 312 formed on the face side of the die 304-3 and the backside of the die 304-2. In one embodiment, the ILD 312 comprises a high-dielectric constant (high-k) dielectric material, such as tantalum pentoxide or the like. The ILD between other metal layers may comprise a conventional dielectric material, such as silicon dioxide, phospho-Silicate Glass (PSG), Boron-Doped PSG (BPSG), tetraethyl-ortho-silicate (TEOS), and the like. That is, the dielectric constant of the ILD 312 may be higher than the dielectric constant of the material between the other metal layers. In this manner, the MIM capacitor 306 may exhibit higher capacitance.

The die 304-1 includes metal layers 334, vias 338, and an array of bump contacts 336 on the face side. The vias 338 are TDVs. At the backside of the die 304-1, the TDVs 338 are electrically connected to respective ones of the lands 328 on the face side of the die 304-2. At the face side of the die 304-1, the TDVs 338 are electrically connected to respective ones of the bump contacts 336. The die 304-1 is configured for flip-chip bonding with the carrier substrate 302 by electrically and mechanically coupling the bump contacts 336 with matching conductors on the carrier substrate (e.g., conductive lands).

The carrier substrate 302 includes conductive interconnect, similar to that of the die 304. Notably, at the top surface of the carrier substrate 302, a conductive layer is patterned to form lands 342. The substrate 302 may also include various metal layers and vias, similar to the die 304 (not shown). The die 304-1 is mounted face down on the top surface of the carrier substrate 302 in a flip-chip manner. The carrier substrate 302 includes an array of solder balls 350 on the bottom surface thereof. The solder balls 350 may be registered with matching conductors on a circuit board, for example, and then reflowed to electrically connect the semiconductor device 300 to the circuit board.

Although three die 304 are shown by example, it is to be understood that the semiconductor device 300 may generally include a plurality of die (e.g., two, three, four, or more than four dice). Although a single MIM capacitor is shown between the top two die, those skilled in the art will appreciate that one or more MIM capacitors may be formed as described above between any two die in the semiconductor device. MIM capacitors between adjacent dice can be formed in the manner shown, for example, in FIG. 1. MIM capacitors between non-adjacent dice can be implemented using TDVs that extend through the one or more intervening dice. For purposes of clarity, only portions of the conductive interconnect in each of the die 304 are shown as related to the MIM capacitor 306. Those skilled in the art will appreciate that the die 304-1 through 304-3 may have more elaborate interconnect structures (e.g., more metal layers, more vias, etc.).

In one embodiment, the MIM capacitor 306 is coupled across power and ground in a power distribution network of the semiconductor device 300 in order to function as a decoupling capacitor. The portion 360 of the conductive layer 308-1 may provide ground, and the portion 362 of the conductive layer 326 may provide power. The portions 360 and 362 receive ground and power through connections to their respective ones of the lands 313 and 328, the die 304-2, the die 304-1, and the carrier substrate 302. In this manner, a decoupling capacitor may be fabricated closer to the power grid of the die 304-3 and/or 304-2 than would be possible with capacitors included on the carrier substrate 302 or on a circuit board, which provides for less parasitic inductance. For example, the MIM capacitor 306 may be configured to exhibit capacitance in the range of 10 nF to 100 nF, with a parasitic inductance of less than 100 pH.

Figure 12:
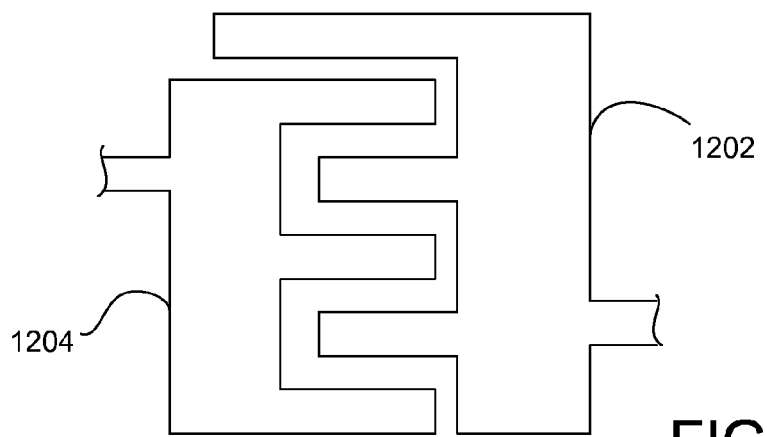
FIG. 12 is a plan view showing a lateral capacitor.

In the above described embodiments, the MIM capacitors formed between integrated circuit die are parallel plate capacitors. Those skilled in the art will appreciate that other types of capacitors may be formed between integrated circuit die. For example, FIG. 12 is a plan view showing a lateral capacitor 1200. The lateral capacitor 1200 includes a first metal region 1202 and a second metal region 1204. Collectively, the metal regions 1202 and 1204 compose a portion of a metal layer in an integrated circuit die. The metal regions 1202 and 1204 include interweaved finger portions for providing capacitance. The lateral capacitor 1200 may be patterned in one of the layers 108-3 and 108-4 of the die 104-3 in FIG. 1. Alternatively, the lateral capacitor 1200 may be patterned in one of the layers 226-3 and 226-4 of the die 204-2 in FIG. 2. The lateral capacitor 1200 is merely exemplary. Those skilled in the art will appreciate that various other types of lateral capacitors having well known configurations may also be formed between two integrated circuit die.

Figure 4:
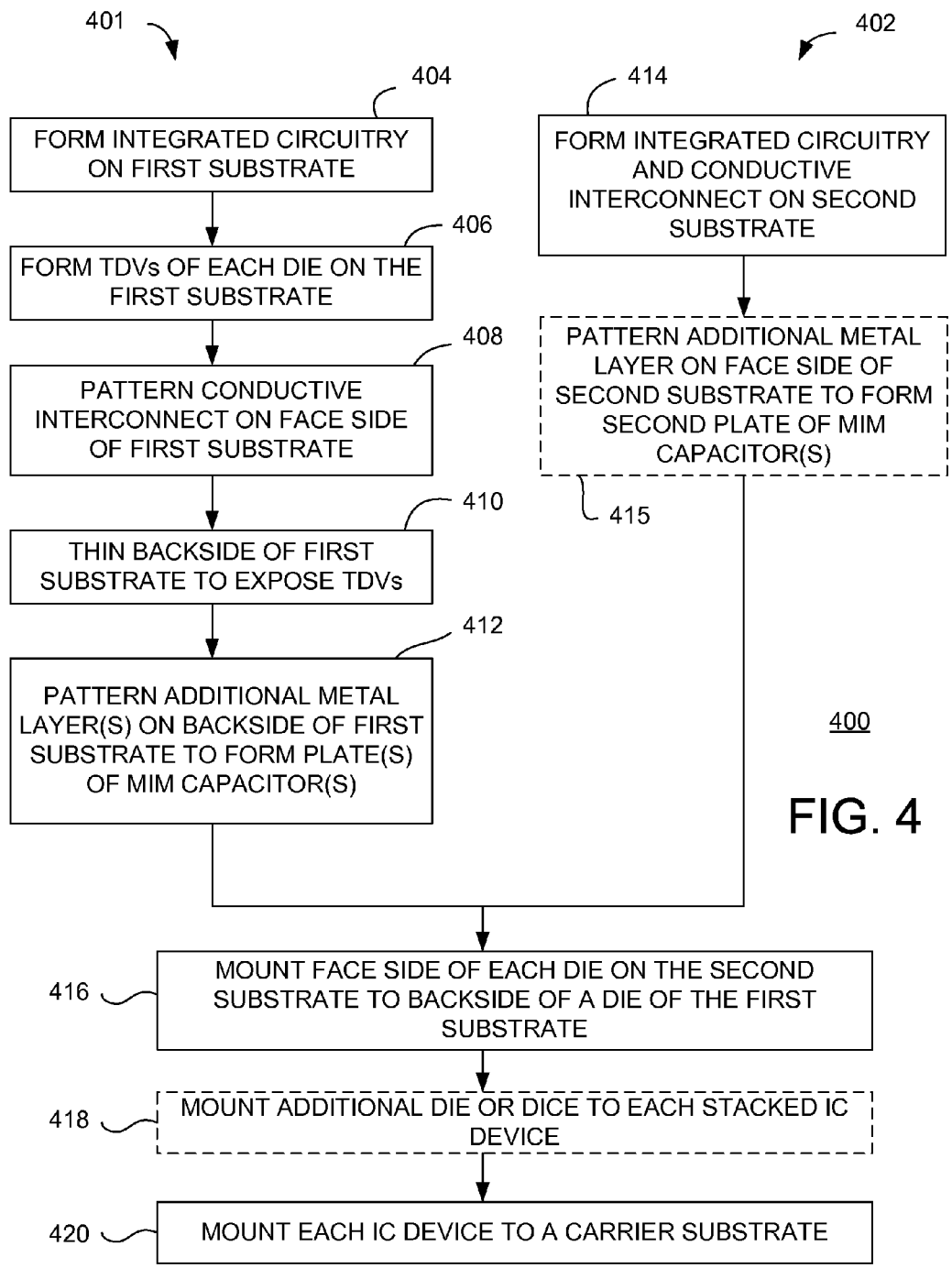
FIG. 4 is a flow diagram depicting an exemplary embodiment of a method for fabricating a semiconductor device in accordance with one or more aspects of the invention.

FIG. 4 is a flow diagram depicting an exemplary embodiment of a method 400 for fabricating a semiconductor device in accordance with one or more aspects of the invention. In the method 400, one or more MIM capacitors are fabricated on the backside of a first substrate. The term "substrate" is meant to encompass a single die or a wafer having multiple dice. A face side of each die of the second substrate is configured to be mounted to the backside of a die of the first substrate, thereby forming one or more stacked IC devices. An example of such a device is shown in FIG. 2. FIGS. 5 through 8 are cross-sectional views of a die of the first substrate corresponding to the fabrication steps described below. For clarity, elements in FIGS. 5-8 that are the same as those in FIG. 2 are designated with identical reference numerals.

Figure 5:
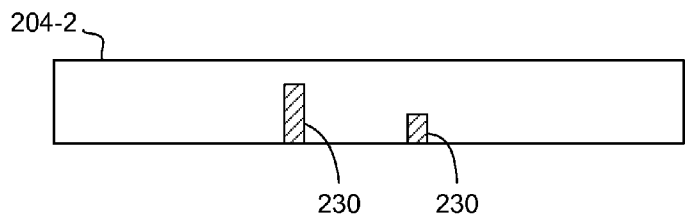
FIGS. 5 through 8 are cross-sectional views of a die corresponding to the fabrication steps of the method of FIG. 4.

The method 400 includes two processes 401 and 402, which can be performed sequentially or in parallel. The process 401 begins at step 404, where integrated circuitry is formed on the first substrate (not shown). The integrated circuitry may be formed using conventional semiconductor manufacturing processes. At step 406, TDVs are formed for each die on the first substrate. The TDVs extend from the face side towards the backside of the first substrate. The TDVs may be formed using a conventional etching process. FIG. 5 shows the die 204-2 with TDVs 230 formed therein.

Figure 6:
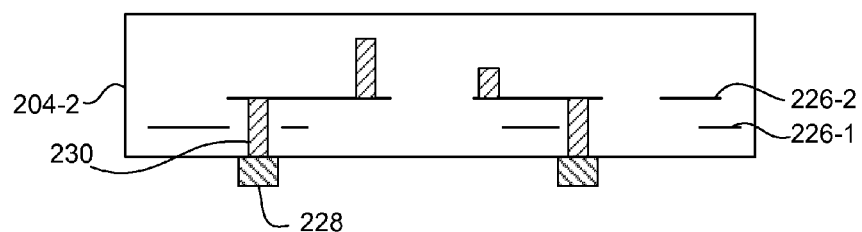

At step 408, conductive interconnect is patterned on the face side of the first substrate. The conductive interconnect is patterned such that each of the TDVs is electrically coupled to a metal layer. The conductive interconnect may be formed using conventional photolithography and deposition processes. FIG. 6 shows the die 204-2 with the metal layers 226-1 and 226-2 formed and coupled to the vias 230.

Figure 7:
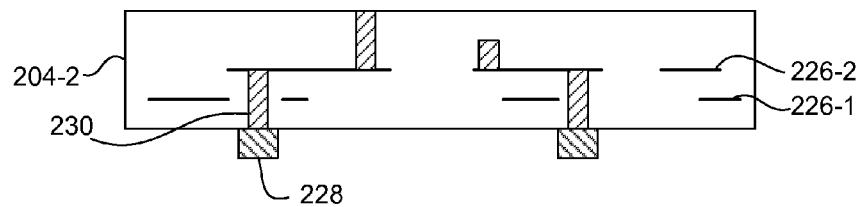
Figure 8:
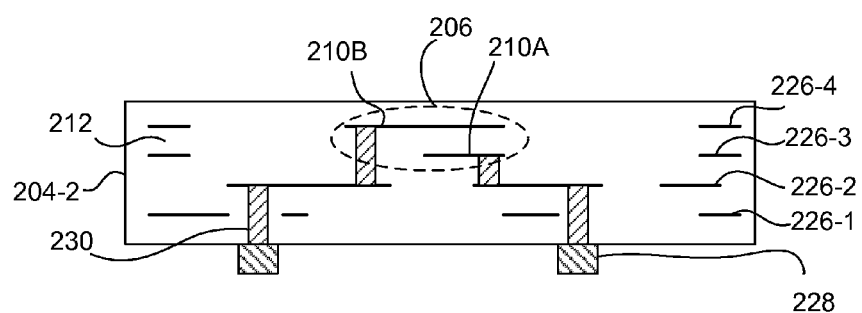

At step 410, the backside of the first substrate is thinned to expose the TDVs. The first substrate may be thinned using a conventional etching process. FIG. 7 shows the die 204-2 with the TDVs 230 exposed. At step 412, at least one metal layer is patterned on the backside of the first substrate to form at least one plate of one or more MIM capacitors. In one embodiment, two metal layers are patterned on the backside of the first substrate to form both plates of each MIM capacitor. In another embodiment, a single metal layer is patterned on the backside of the first substrate to form one plate of each MIM capacitor. The second plate of each MIM capacitor is formed on a second substrate, as described below. In either embodiment, Each of the MIM capacitors is electrically coupled to at least one TDV. FIG. 8 shows the die 204-2 with the metal layers 226-3 and 226-4 forming the plates 210A and 2108 of an MIM capacitor. Although two plates are shown, in some embodiments only one plate is formed as described above.

The process 402 includes step 414, where integrated circuitry and conductive interconnect are formed on the second substrate. At optional step 415, an additional metal layer is patterned on the face side of the second substrate to form a second plate of each MIM capacitor. Step 415 is performed if only one metal layer is patterned in step 412.

At step 416, the face side of each die of the second substrate is mounted to the backside of a die of the first substrate thereby forming one or more stacked IC devices. If the substrates comprise wafers, the die are first singulated, as is well known in the art. A stacked IC device is shown in FIG. 2 and described above. At step 418, one or more additional die may be mounted to each stacked IC device (e.g., the die 204-1 in FIG. 2). At step 420, each stacked IC device may be mounted to a carrier substrate (e.g., the carrier substrate 202 in FIG. 2).

Figure 9:
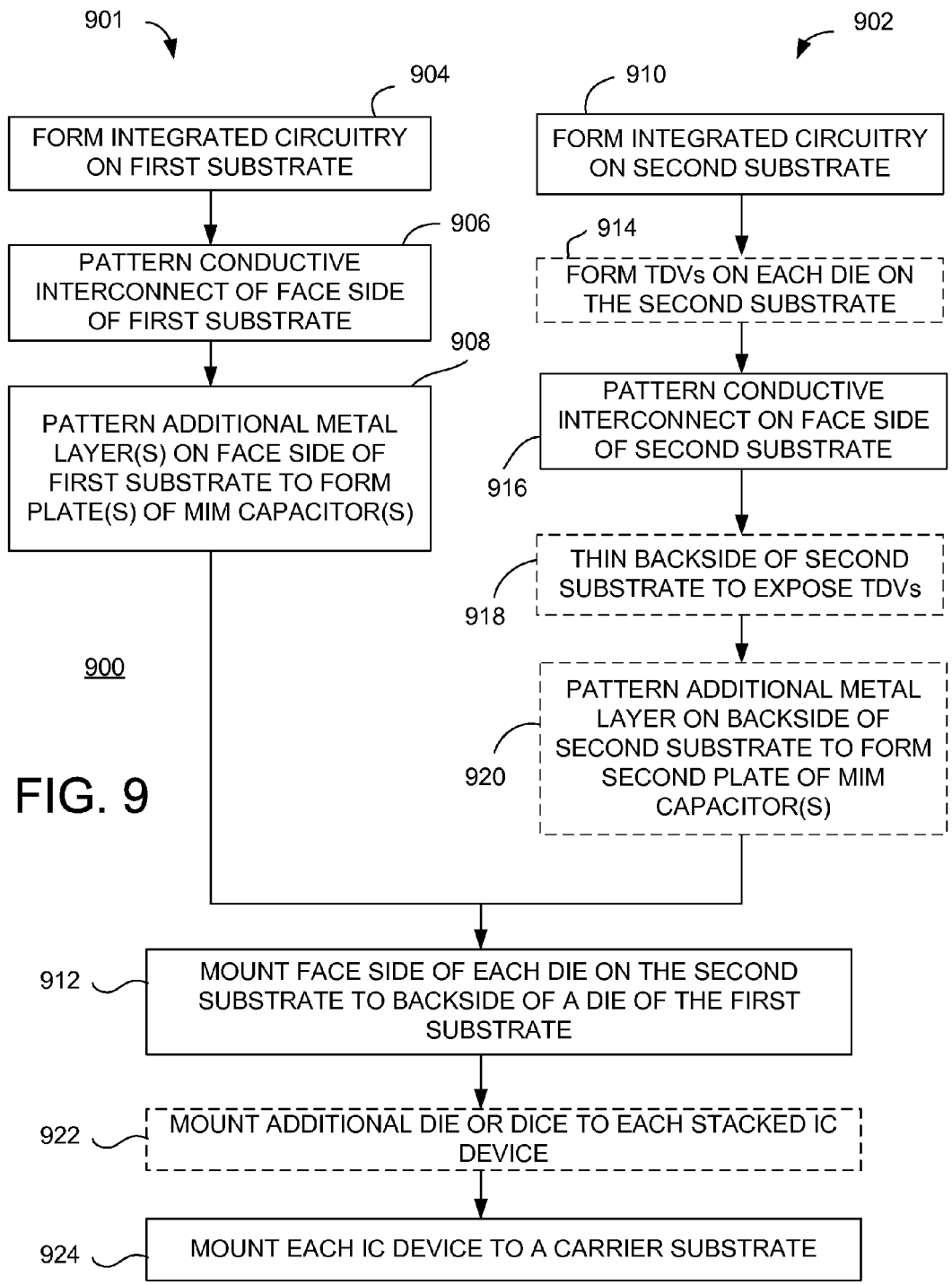
FIG. 9 is a flow diagram depicting another exemplary embodiment of a method for fabricating a semiconductor device in accordance with one or more aspects of the invention.
Figure 10:
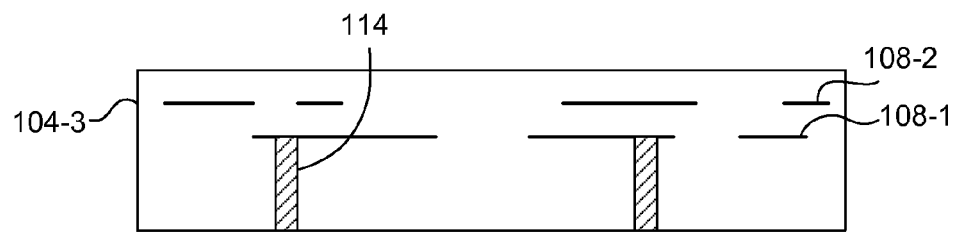
FIGS. 10 and 11 are cross-sectional views of a die corresponding to the fabrication steps described below.
Figure 11:
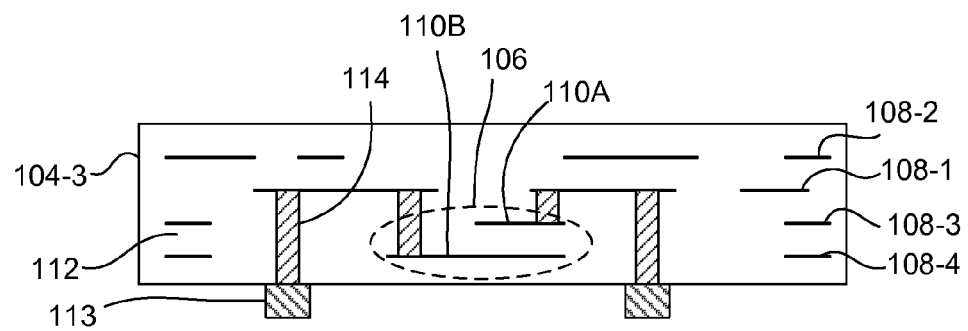

FIG. 9 is a flow diagram depicting another exemplary embodiment of a method 900 for fabricating a semiconductor device in accordance with one or more aspects of the invention. In the method 900, one or more MIM capacitors are fabricated on the face side of a first substrate. The term "substrate" is meant to encompass a single die or a wafer having multiple dice. A face side of each die of the first substrate is configured to be mounted to the backside of a die of the second substrate thereby forming one or more stacked IC devices. An example of such a device is shown in FIG. 1. FIGS. 10 through 11 are cross-sectional views of a die of the first substrate corresponding to the fabrication steps described below. For clarity, elements in FIGS. 10-11 that are the same as those in FIG. 1 are designated with identical reference numerals.

The method 900 includes two processes 901 and 902, which can be performed sequentially or in parallel. The process 901 begins at step 904, where integrated circuitry is formed on the first substrate (not shown). The integrated circuitry may be formed using conventional semiconductor manufacturing processes. At step 906, conductive interconnect is patterned on the face side of the first substrate. The conductive interconnect includes metal layers and vias, such as TDVs. The conductive interconnect and vias may be formed using conventional photolithography, deposition processes, and etching processes. FIG. 10 shows the die 104-3 with the metal layers 108-1 and 108-2 formed, along with a pair of vias 114.

At step 908, additional conductive interconnect having at least one additional metal layer is patterned on the face side of the first substrate to form at least one plate of one or more MIM capacitors. In one embodiment, two metal layers are patterned on the face side of the first substrate to form both plates of each MIM capacitor. In another embodiment, a single metal layer is patterned on the face side of the first substrate to form one plate of each MIM capacitor. The second plate of each MIM capacitor is formed on a second substrate, as described below. In either embodiment, the additional conductive interconnect also includes TDVs. Each of the MIM capacitors is electrically coupled to at least one via formed in step 906 and/or step 908. FIG. 11 shows the die 104-3 with the metal layers 108-3 and 108-4 forming the plates 110A and 110B of an MIM capacitor. Although two plates are shown, in some embodiments only one plate is formed as described above.

The process 902 includes optional steps that are only performed if a single metal layer is patterned on the face of the first substrate to form a single plate of each MIM capacitor. The process 902 begins at step 910, where integrated circuitry is formed on the second substrate. At optional step 914, TDVs are formed for each die on the second substrate. The TDVs extend from the face side towards the backside of the second substrate. The TDVs may be formed using a conventional etching process. At step 916, conductive interconnect is patterned on the face side of the second substrate. The conductive interconnect may be formed using conventional photolithography and deposition processes. At optional step 918, the backside of the second substrate is thinned to expose the TDVs. The second substrate may be thinned using a conventional etching process. At optional step 920, an additional metal layer is patterned on the backside of the second substrate to form a second plate of each MIM capacitor.

At step 912, the face side of each die of the first substrate is mounted to the backside of a die of the second substrate thereby forming one or more stacked IC devices. If the substrates comprise wafers, the die are first singulated, as is well known in the art. An exemplary stacked IC device is shown in FIG. 1 and described above. At step 922, one or more additional die may be mounted to each stacked IC device (e.g., the die 104-1 in FIG. 1). At step 924, each stacked IC device may be mounted to a carrier substrate (e.g., the carrier substrate 102 in FIG. 1).

Figure 13:
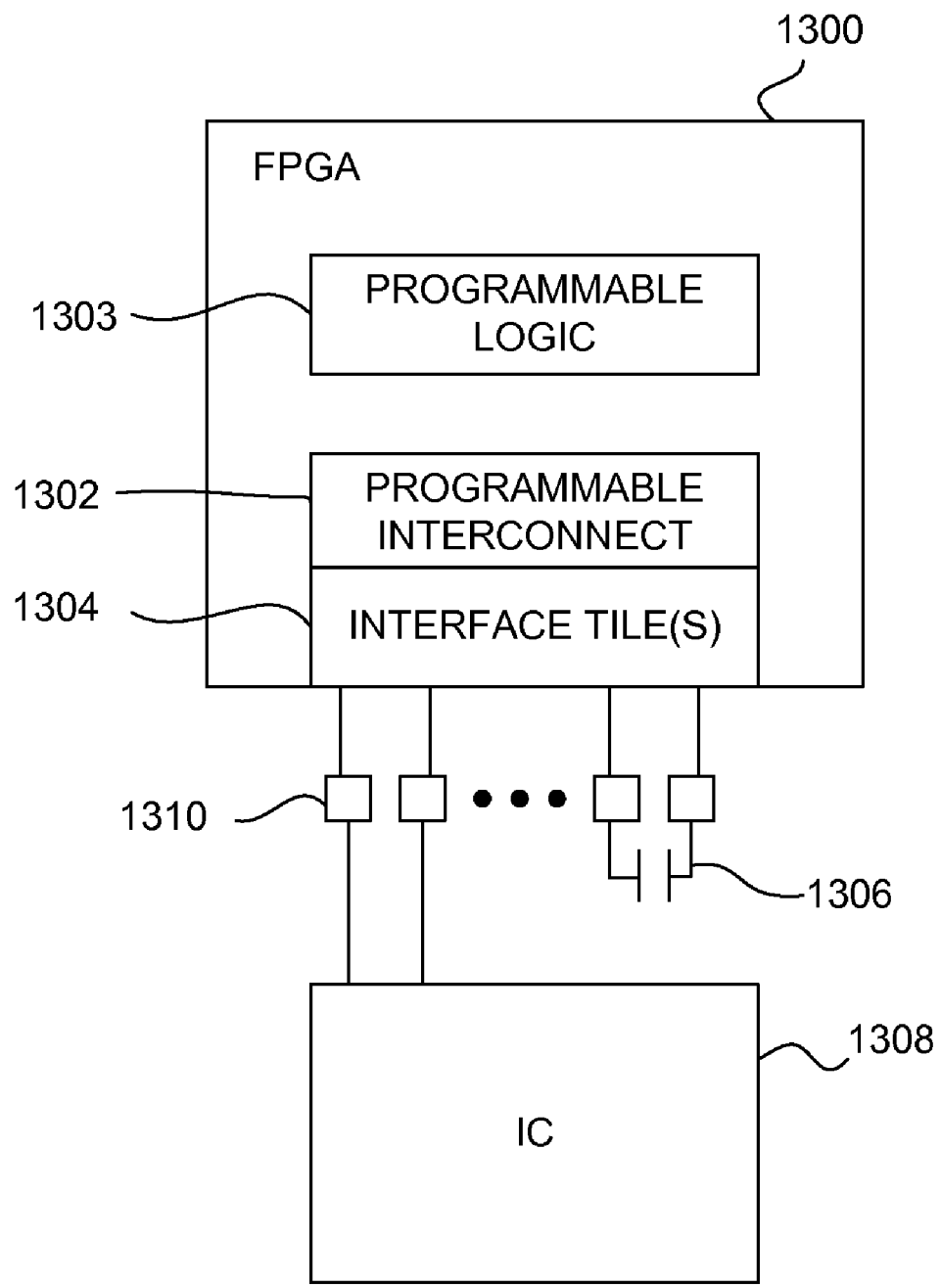
FIG. 13 is a logical block diagram depicting an exemplary embodiment of an IC mounted to a field programmable gate array (FPGA) in accordance with one or more aspects of the invention.

FIG. 13 is a logical block diagram depicting an exemplary embodiment of an IC 1308 mounted to an FPGA 1300 in accordance with one or more aspects of the invention. Physically, the IC 1308 may be mounted to the FPGA 1300 in a stacked-die arrangement, similar to the devices shown in FIGS. 1 through 3. The FPGA 1300 is fabricated to include programmable logic 1303 and programmable interconnect 1302. The programmable logic 1303 may include various types of configurable logic elements, such as configurable logic blocks (CLBs), input/output logic blocks (IOBs), block random access memory (BRAM), and the like, which are well known in the art. The FPGA 1300 may include other types of elements as is known in the art, such as embedded processors, multi-gigabit transceivers (MGTs), and the like. The programmable interconnect 1302 generally includes a configuration of switch circuits and conductor segments. The programmable interconnect 1302 allows the programmable logic 1303 to be interconnected in a desired way to realize a user-defined circuit design.

The programmable interconnect 1302 also includes one or more interface tiles 1304. The interface tiles 1304 connect to and are part of the programmable interconnect 1302. The interface tiles 1304 provide a general-purpose mechanism for coupling signals between the integrated circuit 1308 and the programmable interconnect 1302 of the FPGA 1300. The interface tiles 1304 may comprise conductor segments directly coupled to logic resources in the FPGA 1300. Alternatively, the interface tiles 1304 may include driver circuits, receiver circuits, buffers, and the like. An exemplary interface tile is described in commonly-assigned U.S. Pat. No. 7,068,072, issued Jun. 27, 2006 to New et al., which is incorporated by reference herein. Notably, the interface tiles 1304 are coupled to an array of conductive lands 1310 on either the face side or the backside of the FPGA die. The IC 1308 is electrically coupled to the conductive lands 1310 to establish interconnection between the FPGA 1300 and the IC 1308. An MIM capacitor 1306 is fabricated between the die of the FPGA 1300 and the die of the IC 1308, e.g., in the manner shown in FIG. 1, 2, or 3. The MIM capacitor 1306 is coupled to the interface tiles 1304 via the conductive lands 1310. In this manner, the MIM capacitor 1306 is coupled to the programmable interconnect 1302 and thereby may be programmably coupled to the programmable logic 1303. This arrangement allows a user to employ the MIM capacitor 1306 in a user-defined circuit design, for example.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A method of fabricating a semiconductor device, the method comprising:
   forming through die vias (TDVs) each extending from a first side of a first substrate towards a second side of the first substrate;
   forming conductive interconnect on the first side of the first substrate, the conductive interconnect being electrically coupled to the TDVs;
   patterning at least one metal layer on the second side of the first substrate to form at least one plate of at least one metal-insulator-metal (MIM) capacitor, the at least one MIM capacitor being electrically coupled to at least one of the TDVs;
   forming a second metal layer on a first side of a second substrate to form a second plate of the at least one MIM capacitor;
   patterning an insulator layer on one of the first side of the second substrate or the second side of the first substrate to form a dielectric of the at least one MIM capacitor; and
   mounting the first side of the second substrate to the second side of the first substrate to form a stacked integrated circuit.

2. The method of claim 1, wherein the first substrate comprises first dice, the second substrate comprises second dice, and wherein the method further comprises:
   mounting a face side of each of the second dice to a backside of a corresponding one of the first dice to form stacked integrated circuits.

3. A method of fabricating a semiconductor device, comprising:
   forming integrated circuitry on a face side of a first substrate;
   wherein the first substrate comprises first dice;
   forming through die vias (TDVs) each extending from the face side of the first substrate towards a backside of the first substrate;
   forming conductive interconnect on the face side of the first substrate, the conductive interconnect being electrically coupled to the TDVs;
   thinning the backside of the first substrate to expose the TDVs; and
   patterning at least one metal layer on the backside of the first substrate to form at least one plate of at least one metal-insulator-metal (MIM) capacitor, the at least one MIM capacitor being electrically coupled to at least one of the TDVs;
   wherein the at least one metal layer comprises a first metal layer and the at least one plate comprises a first plate;
   forming integrated circuitry and conductive interconnect on a second substrate, the second substrate comprising second dice;
   patterning a second metal layer on a face side of the second substrate to form a second plate of the at least one MIM capacitor;
   patterning an insulator layer on one of the face side of the second substrate and the backside of the first substrate to form a dielectric of the at least one MIM capacitor; and
   mounting a face side of each of the second dice to a backside of a corresponding one of the first dice to form stacked integrated circuits.

4. The method of claim 2, further comprising:
   mounting each of the stacked integrated circuits to a carrier substrate.

5. The method of claim 1, wherein the forming of the second plate includes forming the second plate parallel to the first plate.

6. The method of claim 1,
   wherein the conductive interconnect includes programmable interconnect having one or more interface tiles, and one of the one or more interface tiles electrically coupled to one of the TDVs.

7. The method of claim 6, further comprising patterning an insulator layer on the face side of the second substrate and patterning an insulator layer the backside of the first substrate to form a dielectric of the at least one MIM capacitor.

8. The method of claim 7, further comprising mounting the stacked integrated circuit to a carrier substrate.

9. The method of claim 6, wherein the second side of the first substrate is a backside of the first substrate.

10. The method of claim 6, wherein the first side of the second substrate is a face side of the second substrate.

11. The method of claim 6, wherein:
the second side of the first substrate is a backside of the first substrate;
the first side of the second substrate is a face side of the second substrate, and
the patterning of the insulator layer includes patterning an insulator layer on the face side of the second substrate and patterning an insulator layer the backside of the first substrate to form a dielectric of the at least one MIM capacitor.

12. The method of claim 6, wherein the conductive interconnect is programmable, the method further comprising:
fabricating on the first substrate, programmable logic that is coupled to the conductive interconnect, wherein the at least one MIM capacitor is programmably coupled to the programmable logic.

* * * * *